(12) United States Patent
Chen et al.

(10) Patent No.: US 12,033,954 B2
(45) Date of Patent: *Jul. 9, 2024

(54) PACKAGED MODULE WITH BALL GRID ARRAY AND GROUNDING PINS FOR SIGNAL ISOLATION, METHOD OF MANUFACTURING THE SAME, AND WIRELESS DEVICE COMPRISING THE SAME

(71) Applicant: SKYWORKS SOLUTIONS, INC., Irvine, CA (US)

(72) Inventors: Howard E. Chen, Anaheim, CA (US); David Viveiros, Jr., Newbury Park, CA (US); Russ Alan Reisner, Oxnard, CA (US); Robert Francis Darveaux, Corona Del Mar, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,915

(22) Filed: Jan. 24, 2022

(65) Prior Publication Data
US 2022/0254730 A1    Aug. 11, 2022

Related U.S. Application Data

(63) Continuation of application No. 15/883,294, filed on Jan. 30, 2018, now Pat. No. 11,233,014.
(Continued)

(51) Int. Cl.
*H01L 23/552*    (2006.01)
*H01L 23/00*    (2006.01)
(Continued)

(52) U.S. Cl.
CPC ...... *H01L 23/552* (2013.01); *H01L 23/49816* (2013.01); *H01L 23/50* (2013.01);
(Continued)

(58) Field of Classification Search
CPC ........... H01L 23/552; H01L 2924/3025; H01L 23/60; H01L 23/66; H01L 24/16;
(Continued)

(56) References Cited

U.S. PATENT DOCUMENTS 5,955,789 A    9/1999    Vendramin
6,125,042 A    9/2000    Verdi et al.
(Continued)

*Primary Examiner* — Younes Boulghassoul
(74) *Attorney, Agent, or Firm* — Chang & Hale LLP

(57) ABSTRACT

Signal isolation for module with ball grid array. In some embodiments, a packaged module can include a packaging substrate having an underside, and an arrangement of conductive features implemented on the underside of the packaging substrate to allow the packaged module to be capable of being mounted on a circuit board. The arrangement of conductive features can include a signal feature implemented at a first region and configured for passing of a signal, and one or more shielding features placed at a selected location relative to the signal feature to provide an enhanced isolation between the signal feature and a second region of the underside of the packaging substrate.

20 Claims, 7 Drawing Sheets

Related U.S. Application Data

(60) Provisional application No. 62/451,774, filed on Jan. 30, 2017.

(51) Int. Cl.
*H01L 23/498* (2006.01)
*H01L 23/50* (2006.01)
*H01L 23/66* (2006.01)

(52) U.S. Cl.
CPC .............. *H01L 24/17* (2013.01); *H01L 23/66* (2013.01); *H01L 24/16* (2013.01); *H01L 24/32* (2013.01); *H01L 24/73* (2013.01); *H01L 24/92* (2013.01); *H01L 2223/6616* (2013.01); *H01L 2223/6677* (2013.01); *H01L 2224/16227* (2013.01); *H01L 2224/32225* (2013.01); *H01L 2224/73204* (2013.01); *H01L 2224/92125* (2013.01); *H01L 2924/1421* (2013.01); *H01L 2924/15311* (2013.01); *H01L 2924/3025* (2013.01)

(58) Field of Classification Search
CPC .............. H01L 24/17; H01L 23/49816; H01L 23/3128; H01L 23/50; H01L 2924/15311; H01L 2924/15321; H01L 2924/15331; H01L 2924/1421; H01L 2225/06537; H01L 24/14; H05K 1/0222
See application file for complete search history.

(56) References Cited

U.S. PATENT DOCUMENTS

| | | | |
|---|---|---|---|
| 6,906,416 B2 | 6/2005 | Karnezos | |
| 8,102,032 B1* | 1/2012 | Bolognia | H01L 23/3128 |
| | | | 257/659 |
| 11,233,014 B2* | 1/2022 | Chen | H01L 23/50 |
| 2002/0079568 A1* | 6/2002 | Degani | H01L 23/552 |
| | | | 257/E23.114 |
| 2007/0023203 A1 | 2/2007 | Leizerovich et al. | |
| 2008/0067656 A1* | 3/2008 | Leung | H01L 23/5385 |
| | | | 438/109 |
| 2012/0074538 A1 | 3/2012 | Tsai et al. | |
| 2013/0021219 A1 | 1/2013 | Agarwal et al. | |
| 2015/0303971 A1* | 10/2015 | Reisner | H01L 29/737 |
| | | | 330/307 |
| 2016/0099192 A1 | 4/2016 | Chen et al. | |
| 2017/0278830 A1* | 9/2017 | Kim | H01L 25/105 |
| 2017/0287852 A1* | 10/2017 | Jeon | H01L 23/49811 |
| 2018/0096951 A1 | 4/2018 | Chen et al. | |
| 2018/0226361 A1* | 8/2018 | Chen | H01L 23/562 |
| 2018/0240763 A1* | 8/2018 | Chen | H01L 23/50 |
| 2018/0351595 A1* | 12/2018 | Tarui | H05K 1/0204 |

\* cited by examiner

PACKAGED MODULE WITH BALL GRID ARRAY AND GROUNDING PINS FOR SIGNAL ISOLATION, METHOD OF MANUFACTURING THE SAME, AND WIRELESS DEVICE COMPRISING THE SAME

CROSS-REFERENCE TO RELATED APPLICATION(S)

This application is a continuation of U.S. patent application Ser. No. 15/883,294, filed Jan. 30, 2018, entitled "SIGNAL ISOLATION FOR MODULE WITH BALL GRID ARRAY," which claims priority to U.S. Provisional Application No. 62/451,774, filed Jan. 30, 2017, entitled "SIGNAL ISOLATION FOR MODULE WITH BALL GRID ARRAY," the disclosure of each of which is hereby expressly incorporated by reference herein in its respective entirety.

BACKGROUND

Field

The present disclosure relates to packaged radio-frequency (RF) modules.

Description of the Related Art

In many radio-frequency (RF) applications, one or more integrated circuits are implemented in a packaged module. Such a packaged module typically includes a packaging substrate and one or more semiconductor die mounted on the packaging substrate. The packaged module can also include one or more surface-mount technology (SMT) devices having, for example, respective passive circuit elements. Such SMT device(s) can also be mounted on the packaging substrate.

SUMMARY

In accordance with a number of implementations, the present disclosure relates to a packaged module that includes a packaging substrate having an underside, and an arrangement of conductive features implemented on the underside of the packaging substrate to allow the packaged module to be capable of being mounted on a circuit board. The arrangement of conductive features includes a signal feature implemented at a first region and configured for passing of a signal, and one or more shielding features placed at a selected location relative to the signal feature to provide an enhanced isolation between the signal feature and a second region of the underside of the packaging substrate.

In some embodiments, the arrangement of conductive features can include an array of conductive pillars. In some embodiments, the arrangement of conductive features can include a ball grid array.

In some embodiments, the one or more shielding features can include one or more grounding features. In some embodiments, the one or more grounding features can include a surface mounted component on the underside of the packaging substrate and having a grounding path, or one or more grounding solder balls.

In some embodiments, the packaged module can further include an underside component mounted to the underside of the packaging substrate in a volume defined by the ball grid array. The underside component can include, for example, a semiconductor die or a surface-mount technology (SMT) device.

In some embodiments, the packaged module can further include an upper-side component mounted to an upper side of the packaging substrate, such that the packaged module is a dual-sided module having the ball grid array. The underside component and the upper-side component can be parts of a radio-frequency circuit.

In some embodiments, the packaged module can further include an overmold implemented on the upper side of the packaging substrate. In some embodiments, the packaged module can further include a conformal shield layer implemented to cover an upper surface of the overmold and side walls defined by the overmold and the packaging substrate.

In some embodiments, the enhanced isolation associated with the signal feature can be with respect to another signal feature implemented at the second region. In some embodiments, the enhanced isolation associated with the signal feature can be with respect to a component positioned at the second region.

In some implementations, the present disclosure relates to a method for manufacturing a packaged module. The method includes forming or providing a packaging substrate having an underside. The method further includes arranging conductive features on the underside of the packaging substrate to allow the packaged module to be capable of being mounted on a circuit board. The arranging of conductive features includes forming a signal feature at a first region for passing of a signal, and forming one or more shielding features at a selected location relative to the signal feature to provide an enhanced isolation between the signal feature and a second region of the underside of the packaging substrate.

According to some teachings, the present disclosure relates to a wireless device that includes circuit board configured to receive a plurality of modules, a transceiver implemented on the circuit board, and an antenna in communication with the transceiver and configured to facilitate either or both of transmission and reception of respective signals. The wireless device further includes a radio-frequency module mounted on the circuit board with an arrangement of conductive features between an underside of the radio-frequency module and the circuit board such that at least a portion of the radio-frequency module is electrically between the transceiver and the antenna. The arrangement of conductive features includes a signal feature implemented at a first region of the underside of the radio-frequency module and configured for passing of a signal, and one or more shielding features placed at a selected location relative to the signal feature to provide an enhanced isolation between the signal feature and a second region relative to the underside of the radio-frequency module.

In some embodiments, the conductive features can be parts of the radio-frequency module. The conductive features can be arranged as, for example, a ball grid array. The one or more grounding features can include one or more grounding solder balls.

In some embodiments, the second region relative to the underside of the radio-frequency module can include a region on the underside of the radio-frequency module that is laterally offset from the first region.

For purposes of summarizing the disclosure, certain aspects, advantages and novel features of the inventions have been described herein. It is to be understood that not necessarily all such advantages may be achieved in accordance with any particular embodiment of the invention.

Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
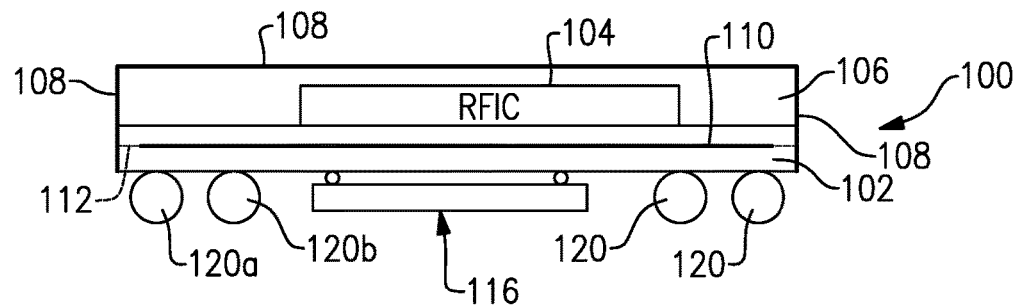
FIG. 1 depicts a side sectional view of a dual-sided module having a ball grid array (BGA) on its underside.

FIG. 1 depicts a side sectional view of a dual-sided module 100 having a ball grid array (BGA) on its underside. More particularly, the module 100 includes a packaging substrate 102 with a radio-frequency (RF) circuit (collectively indicated as 104) implemented on its first side (e.g., upper side), and one or more components (collectively indicated as 116) mounted on its second side (e.g., underside). The RF circuit 104 on the upper side of the packaging substrate 102 can include, for example, one or more semiconductor die, and/or one or more surface-mount technology (SMT) devices. The underside component(s) 116 can include, for example, one or more semiconductor die, and/or one or more SMT devices.

In the example module 100 of FIG. 1, an overmold 106 is shown to be implemented on the upper side of the packaging substrate 102 so as to encapsulate the RF circuit 104. Further, the upper surface of the overmold 106 and the side walls of the module 100 are shown to have a conductive layer 108 (e.g., a conformal conductive layer) that is electrically connected to a ground plane 110 within the packaging substrate 102. Accordingly, the conductive layer 108 and the ground plane 110 generally define an internal volume, and provide RF shielding functionality between the internal volume and external location(s). In some embodiments, the module 100 may or may not include additional shielding functionality (e.g., intra-module shielding between regions within the internal volume).

Although various examples are described herein in the context of modules having such shielding functionalities (e.g., conformal shielding and/or intra-module shielding), one or more features of the present disclosure can also be implemented in modules without such shielding functionalities.

In the example of FIG. 1, the BGA is shown to include a plurality of solder balls 120a, 120b, 120. Such solder balls are shown to be arranged so as to provide an underside volume dimensioned to allow mounting of the underside component(s) 116. Such underside component(s) can be mounted to the underside of the packaging substrate 102 with or without an underfill.

Although various examples are described herein in the context of modules having such a BGA with solder balls, one or more features of the present disclosure can also be implemented in modules with other conductive structures. For example, pillars (e.g., columns, posts, etc.) can be utilized to provide functionalities similar to those of the solder balls.

Among others, additional details related to the foregoing dual-sided module having a BGA can be found in U.S. Patent Application Publication No. 2016/0099192 entitled DUAL-SIDED RADIO-FREQUENCY PACKAGE HAVING BALL GRID ARRAY which is hereby expressly incorporated by reference herein in its entirety.

Figure 2:
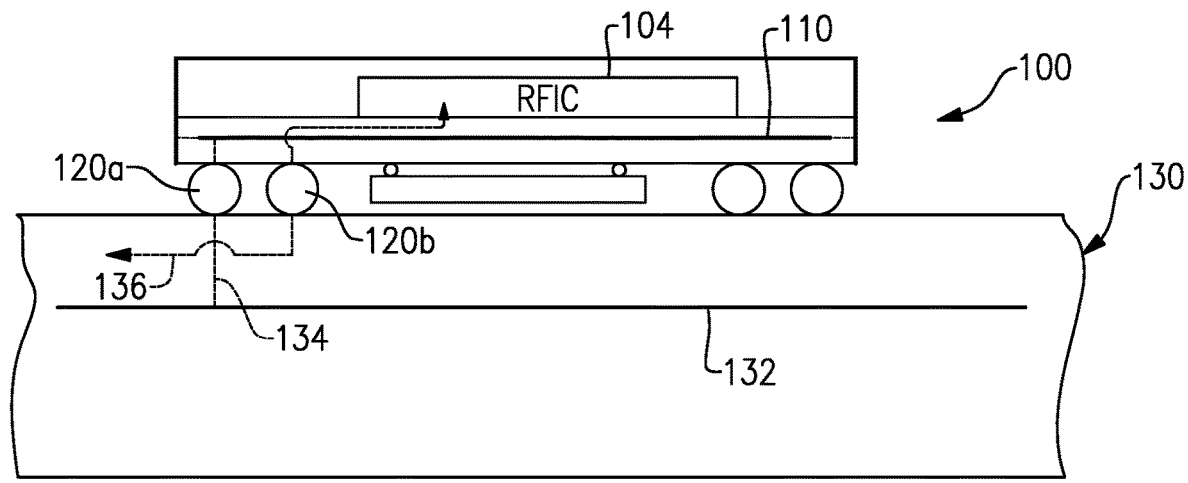
FIG. 2 shows an example where the dual-sided BGA module of FIG. 1 is mounted on a circuit board.

FIG. 2 shows an example where the dual-sided BGA module 100 of FIG. 1 is mounted on a circuit board 130 (e.g., a phone board). Such a circuit board can be configured to include various electrical connections to facilitate various functionalities of the module 100. For example, a ground of the module 100 (e.g., at the ground plane 110) can be electrically connected to a ground of the circuit board 130 (e.g., at a ground plane 132) through an example solder ball 120a. Such an electrical connection is indicated as 134. In another example, a non-ground electrical connection can be made between the RF circuit 104 of the module 100 and another location (e.g., another module) associated with the circuit board 130, through an example solder ball 120b. Such an electrical connection is indicated as 136.

Figure 3:
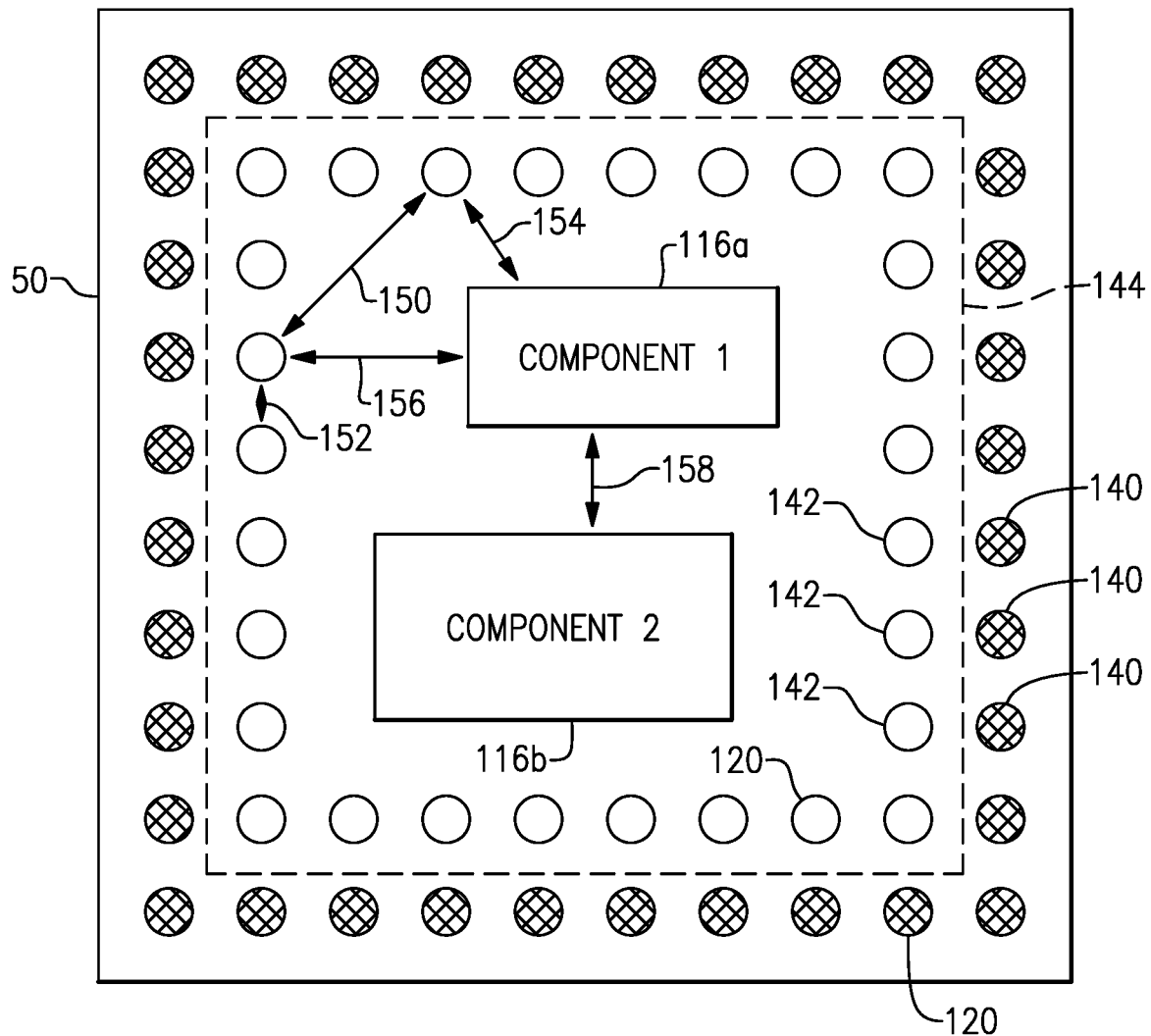
FIG. 3 shows an underside of a module having a BGA with an array of solder balls, and two example components.

In some embodiments, the non-ground electrical connection 136 can facilitate, for example, power supply, control signal, and RF signal associated with operation of the module 100. In some applications, a signal connection such as an RF signal connection can interfere with and/or be interfered by another part of the module 100. For example, FIG. 3 shows an underside of a module 50 having a BGA with an array of solder balls 120, and two example components 116a, 116b. In the example shown, the outer perimeter of solder balls are utilized for grounding purpose, and such ground solder balls or "pins" are indicated as 140. The inner solder balls are utilized for non-grounding purpose, and such non-ground solder balls or pins are indicated as 142.

In the example of FIG. 3, suppose that some of the inner solder balls 142 are utilized for routing signals. Passage of signals through such solder balls can impact or be impacted by one or more parts of the module 50. For example, electromagnetic (EM) interference (depicted as arrow 152) is shown to be present or possible between two adjacent solder balls. One of such solder balls is also shown to provide interference to and/or be interfered by the first component 116*a* (depicted as arrow 156) and another solder ball (depicted as arrow 150). Arrow 154 depicts another example of EM interference between a solder ball and the first component 116*a*. Arrow 158 depicts an EM interference that can exist between the first component 116*a* and the second component 116*b*. It will be understood that there can be more or less instances of EM interference than the examples shown in FIG. 3.

In the example of FIG. 3, the outer solder balls 140 being utilized as ground pins can provide shielding between an interior region (generally depicted as 144) and exterior locations. However, as described above, interference between various locations within the interior region 144 are generally not addressed.

In some embodiments, a dual-sided BGA module such as the example of FIGS. 1 and 2 can be configured to provide intra-module shielding among two or more locations underneath the packaging substrate. Although various examples are described in the context of a dual sided module, it will be understood that one or more features of the present disclosure can also be implemented on the BGA side of a module even if that module does not have any functional components on the other side of the packaging substrate.

Figure 4:
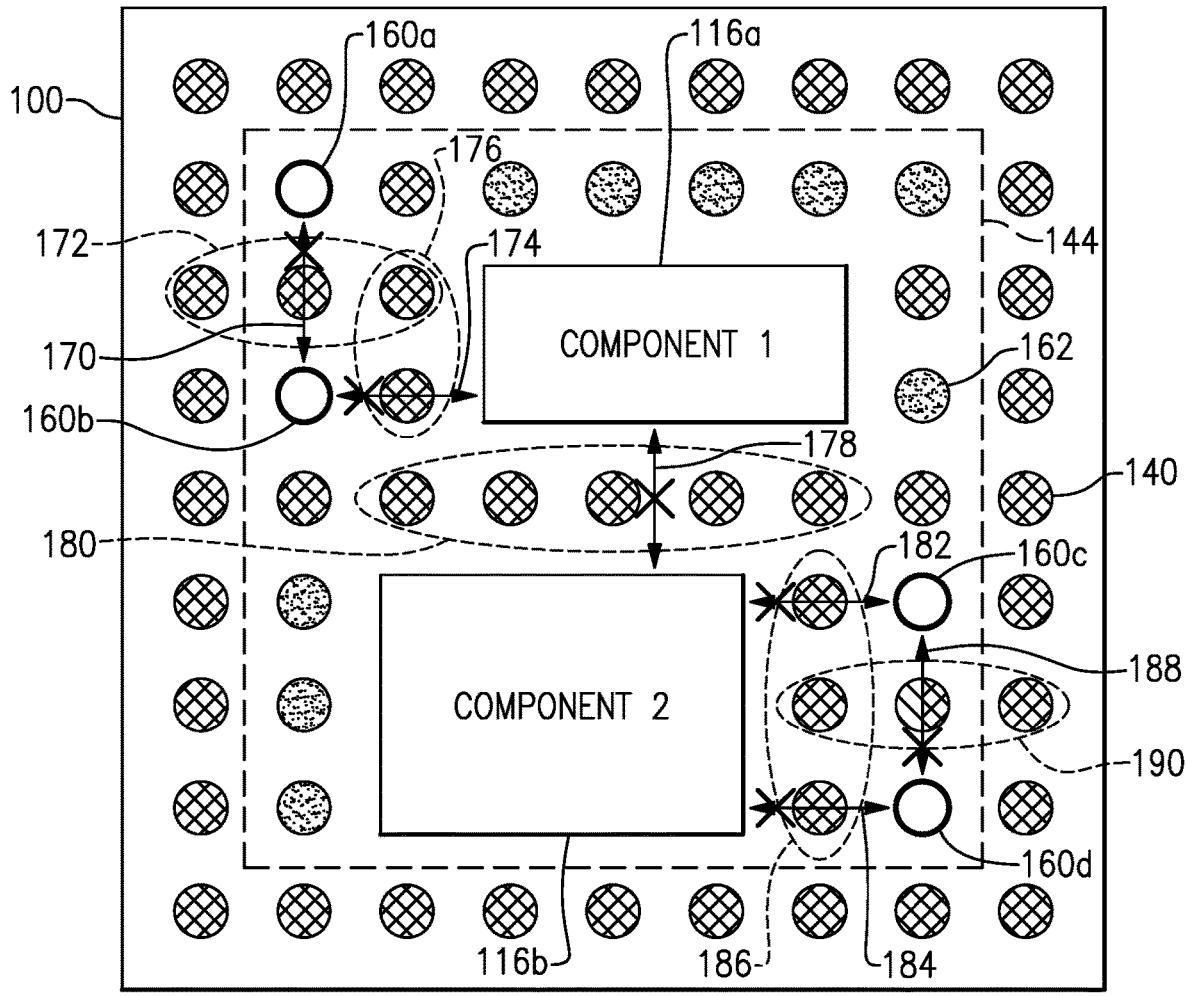
FIG. 4 shows an underside of a module having a BGA with an array of solder balls, and two example components, where one or more pins of the BGA are utilized to provide enhanced electromagnetic isolation between different regions of the underside of the module.

FIG. 4 shows an underside of a module 100 having a BGA with an array of solder balls, and two example components 116*a*, 116*b*. In the example shown, the outer perimeter of solder balls are utilized for grounding purpose, and such ground solder balls or "pins" are indicated as 140. Accordingly, the outer solder balls 140 being utilized as ground pins can provide shielding between an interior region (generally depicted as 144) and exterior locations.

In the example of FIG. 4, some of the inner solder balls are utilized for non-grounding purpose, and such non-ground solder balls or pins can be described as critical signal pins or non-critical pins. For the purpose of description, a critical signal pin can be considered to be a signal pin for which enhanced isolation (e.g., electromagnetic isolation such as signal isolation) is desired. For the purpose of description, a non-critical pin can be a non-ground pin for which enhanced isolation is not applicable or not needed.

In the example of FIG. 4, pins 160*a*, 160*b*, 160*c*, 106*d* (unfilled circles) are assumed to be critical pins, and shaded circles 162 are assumed to be non-critical pins. In the example shown, suppose that enhanced isolation is desired for each of the critical pins (160*a*, 160*b*, 160*c*, 106*d*), as wells as part or all of each of the two components 116*a*, 116*b*. To provide such enhanced isolation, one or more pins such as ground pins (diamond fill pattern circles) can be provided relative to a critical pin or a component.

For example, suppose that enhanced isolation is desired between the two critical pins 160*a* and 160*b*. To achieve such an enhanced isolation, one or more of the ground pins indicated as 172 can be provided to be generally between the two critical pins. Accordingly, EM interference (arrow 170) between the two critical pins 160*a* and 160*b* can be reduced or substantially eliminated (indicated by "X") by some or all of the ground pins 172. Similarly, suppose that enhanced isolation is desired between the two critical pins 160*c* and 160*d*. To achieve such an enhanced isolation, one or more of the ground pins indicated as 190 can be provided to be generally between the two critical pins. Accordingly, EM interference (arrow 188) between the two critical pins 160*c* and 160*d* can be reduced or substantially eliminated (indicated by "X") by some or all of the ground pins 190.

In another example, suppose that enhanced isolation is desired between the critical pin 160*b* and the first component 116*a*. To achieve such an enhanced isolation, one or more of the ground pins indicated as 176 can be provided to be generally between the two parts. Accordingly, EM interference (arrow 174) between the critical pin 160*b* and the first component 116*a* can be reduced or substantially eliminated (indicated by "X") by some or all of the ground pins 176. Similarly, suppose that enhanced isolation is desired between the critical pin 160*c* and the second component 116*b*. To achieve such an enhanced isolation, one or more of the ground pins indicated as 186 can be provided to be generally between the two parts. Accordingly, EM interference (arrow 182) between the critical pin 160*c* and the second component 116*b* can be reduced or substantially eliminated (indicated by "X") by some or all of the ground pins 186. Similarly, suppose that enhanced isolation is desired between the critical pin 160*d* and the second component 116*b*. To achieve such an enhanced isolation, one or more of the ground pins indicated as 186 can be provided to be generally between the two parts. Accordingly, EM interference (arrow 184) between the critical pin 160*d* and the second component 116*b* can be reduced or substantially eliminated (indicated by "X") by some or all of the ground pins 186.

In yet another example, suppose that enhanced isolation is desired between the first component 116*a* and the second component 116*b*. To achieve such an enhanced isolation, one or more of the ground pins indicated as 180 can be provided to be generally between the two components. Accordingly, EM interference (arrow 178) between the first and second components 116*a*, 116*b* can be reduced or substantially eliminated (indicated by "X") by some or all of the ground pins 180.

Figure 5:
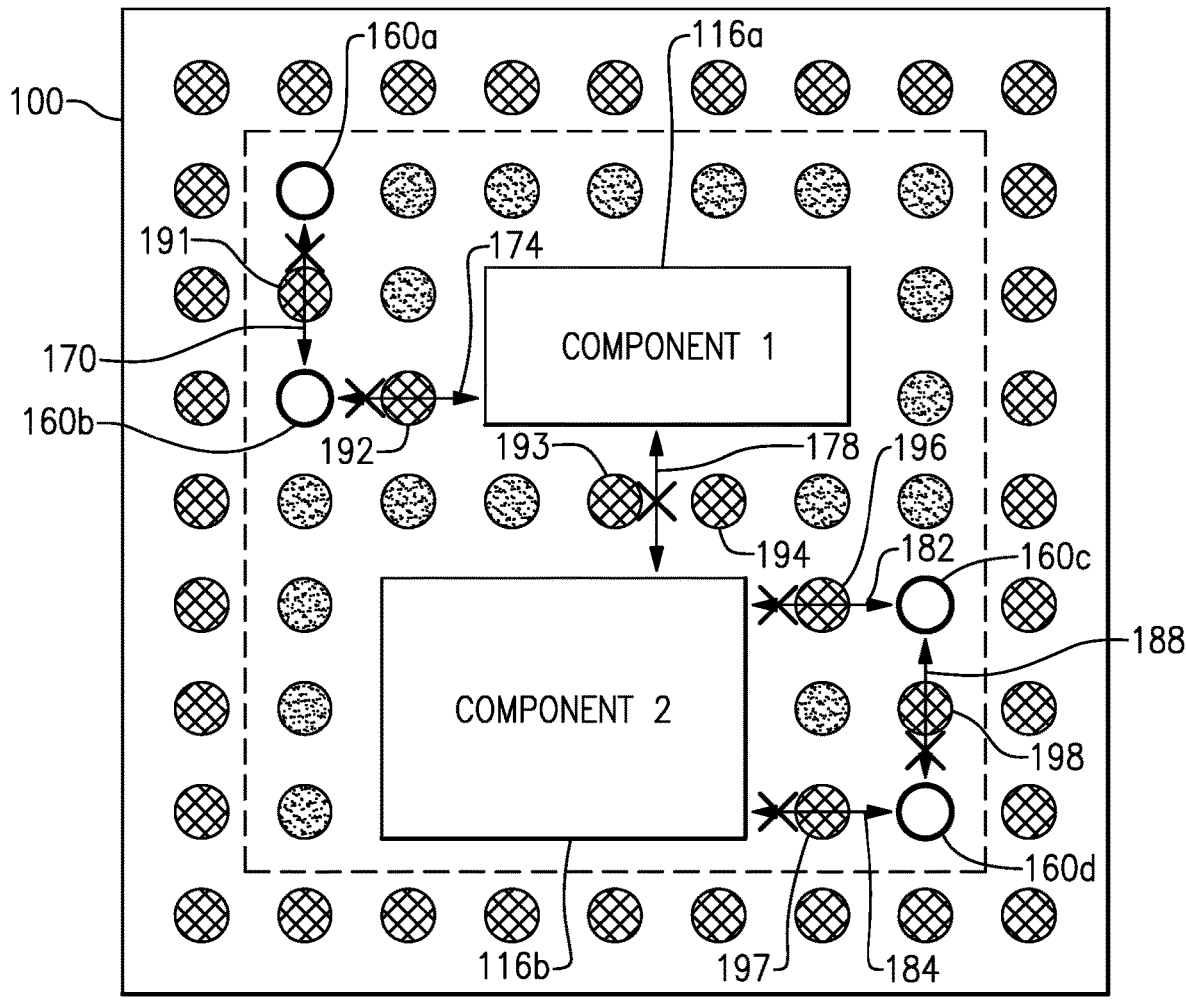
FIG. 5 shows another example of an underside of a module having a BGA with an array of solder balls, and two example components, where different numbers and/or arrangements of pins of the BGA can be utilized to provide enhanced electromagnetic isolation between different regions of the underside of the module.

In the various enhanced signal isolation examples of FIG. 4, each part (critical pins 160*a*, 160*b*, 160*c*, 106*d*, first component 116*a*, or second component 116*b*) of interest is shown to be generally surrounded by ground pins. In some embodiments, a part for which enhanced signal isolation is desired may or may not be fully surrounded by ground pins. For example, FIG. 5 shows an underside of a module 100 having a BGA with an array of solder balls, and two example components 116*a*, 116*b*. In FIG. 5, the critical pins 160*a*, 160*b*, 160*c*, 106*d* and the first and second components 116*a*, 116*b* are assumed to be parts of interest for which enhanced isolation is desired. Similar to FIG. 4, ground pins are depicted as diamond pattern filled circles, non-critical pins are depicted as shaded circles, and critical pins are depicted as unfilled circles.

In the example of FIG. 5, however, each of the critical pins 160*a*, 160*b*, 160*c*, 106*d* is not necessarily surrounded by ground pins. For example, to provide enhanced isolation (arrow 170 with an "X") between the critical pins 160*a* and 160*b*, placement of a single ground pin 191 may be sufficient. Similarly, placement of a single ground pin 198 may be sufficient to provide enhanced isolation (arrow 188 with an "X") between the critical pins 160*c* and 160*d*. Similarly, placement of a single pin (192, 196, or 197) may be sufficient to provide corresponding enhanced isolation (arrow 174, 182, or 184 with an "X") between respective parts.

In another example, to provide enhanced isolation (arrow 178 with an "X") between the first and second components 116*a*, 116*b*, placement of two ground pins (193, 194) may be sufficient (instead of the example five pins 180 in FIG. 4).

In the examples of FIGS. 4 and 5, it is assumed that the outer pins are being utilized as ground pins. In some embodiments, some or all of the outer pins may be utilized as non-ground pins, and at least some of such non-ground pins may be critical pins for which enhanced isolation is desired.

Figure 6:
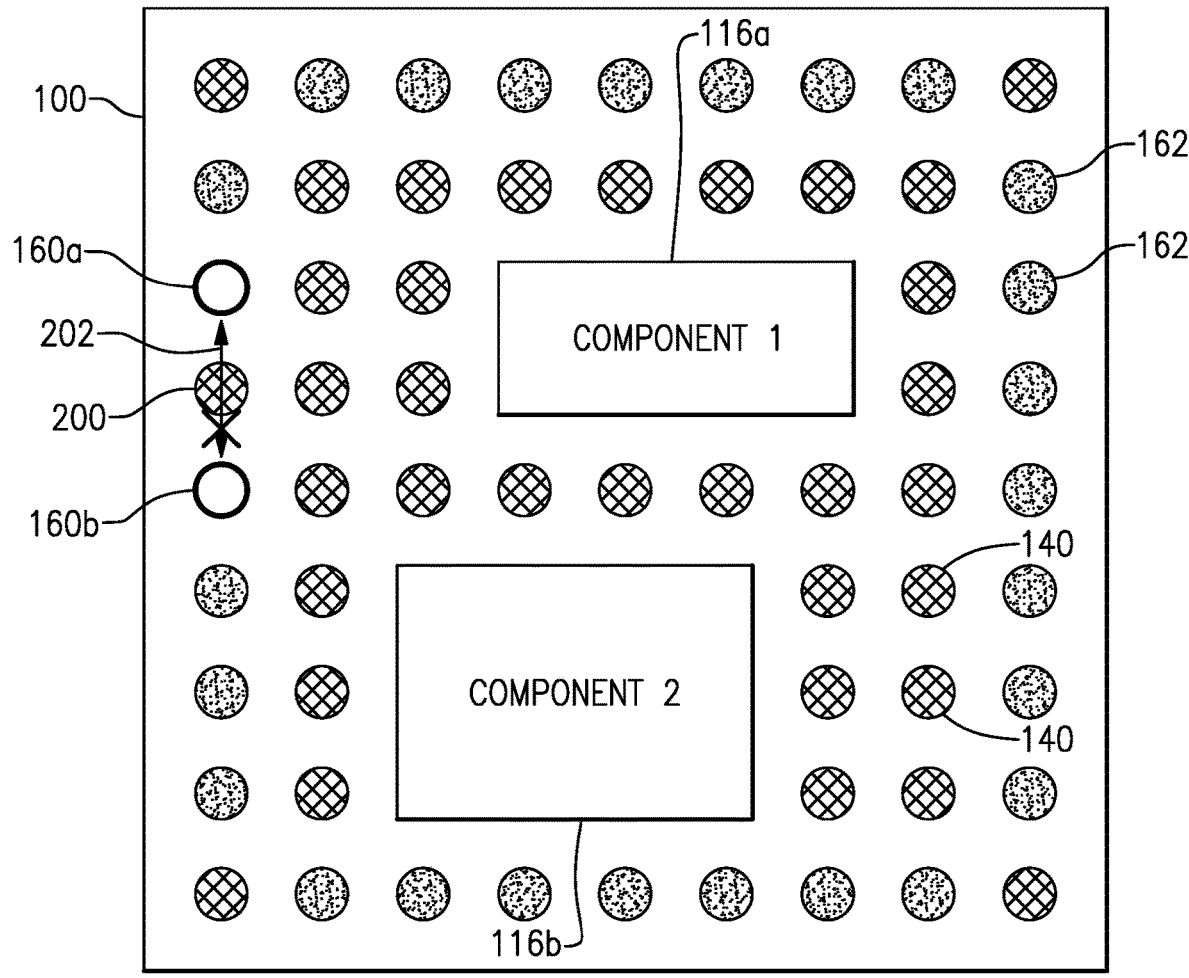
FIG. 6 shows yet another example of an underside of a module having a BGA with an array of solder balls, and two example components, where one or more pins of the BGA can be utilized to provide enhanced electromagnetic isolation between an outer pin of the BGA and another region of the underside of the module.

For example, FIG. 6 shows an underside of a module 100 having a BGA with an array of solder balls, and two example components 116a, 116b. In FIG. 6, critical pins 160a and 160b are shown to be positioned on the outer perimeter, and are assumed to be parts of interest for which enhanced isolation is desired. Similar to FIGS. 4 and 5, ground pins are depicted as diamond pattern filled circles, non-critical pins are depicted as shaded circles, and critical pins are depicted as unfilled circles.

In the example of FIG. 6, enhanced isolation between the two critical pins 160a, 160b can be achieved by placement of a ground pin 200. Such a ground pin may be sufficient to provide enhanced isolation (arrow 202 with an "X") between the critical pins 160a and 160b.

In some embodiments, and as described herein, enhanced isolation between two underside parts of a module can be achieved by selective placement of ground pin(s) or solder ball(s). In situations where a plurality of ground pins are utilized for such purpose, the ground pins can be spaced appropriately so as to substantially block or significantly reduce the amount of interference between the two parts, even though the shielding structure is not a solid or continuous barrier.

Figure 7:
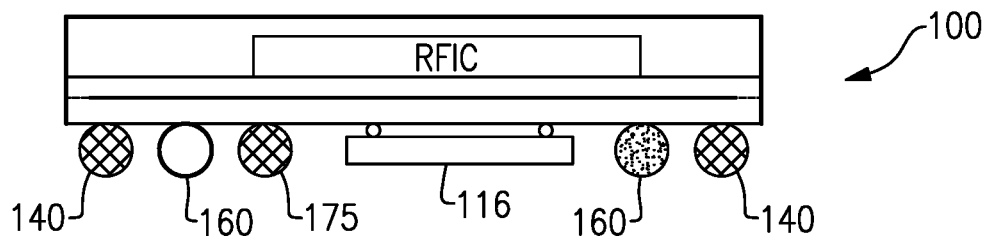
FIG. 7 depicts a side sectional view of a module having a BGA having selective placement of one or more ground solder balls to provide enhanced signal isolation, similar to the examples of Figures.
Figure 8:
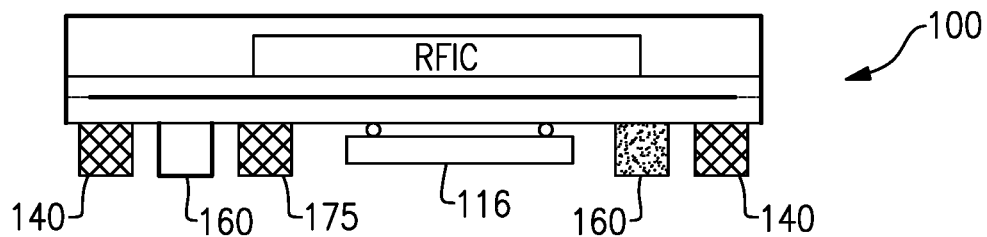
FIG. 8 shows a module that is similar to the example of FIG. 7, but in which pillars such as columns or posts can be utilized instead of solder balls.

FIG. 7 depicts a side sectional view of a module 100 having a BGA having selective placement of one or more ground solder balls 175 to provide enhanced isolation for a critical signal pin 160, similar to the examples of FIGS. 4-6. In some embodiments, similar isolation functionality can be implemented for modules having pillars instead of solder balls. For example, FIG. 8 shows a module 100 that is similar to the example of FIG. 7, except that pillars (e.g., columns, posts, etc.) are utilized instead of solder balls. Thus, enhanced isolation can be provided for a critical signal pillar 160 by one or more ground pillars 175.

Figure 9:
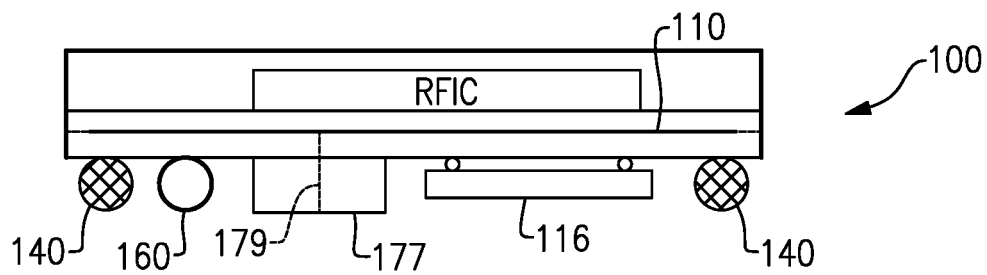
FIG. 9 shows that in some embodiments, a grounding feature selected to provide an enhanced signal isolation as described herein can be provided by a surface mounted component.

FIG. 9 shows that in some embodiments, a grounding feature selected to provide an enhanced isolation for a critical signal pin can be provided by a surface mounted component 177. Such a component can be configured to provide an electrical connection (179) between the lower surface of the component 177 and the ground plane 110 of the module 100. With such a configuration, the component 177 can provide a ground contact at a selected location to thereby provide enhanced isolation as described herein, when the module 100 is mounted on a circuit board (and the lower surface of the component 177 is electrically connected to a ground plane of the circuit board). In some embodiments, such a component can be, for example, a filter device such as a chip size SAW (surface acoustic wave) device (CSSD).

In some embodiments, a packaged module having one or more features can be fabricated utilizing, for example, some or all of the manufacturing techniques described in the above-referenced U.S. Patent Application Publication No. 2016/0099192 entitled DUAL-SIDED RADIO-FREQUENCY PACKAGE HAVING BALL GRID ARRAY.

In some implementations, a packaged module having one or more features as described herein can be utilized in various products. For example, FIGS. 10 and 11 show examples of how a packaged module having one or more features as described herein can be configured for use in a wireless device, and/or be implemented in a wireless device.

Figure 10:
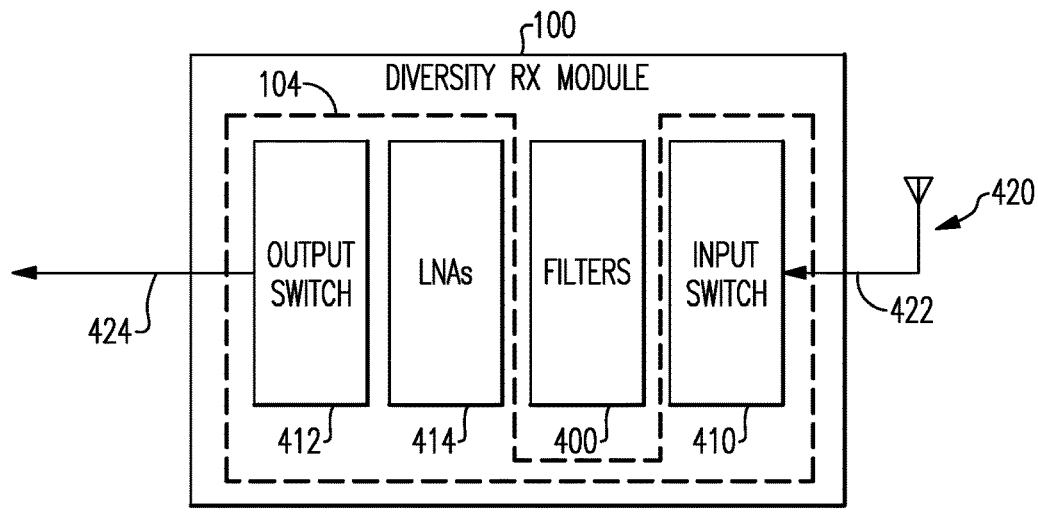
FIG. 10 shows an example of a radio-frequency (RF) module having one or more features as described herein.
Figure 11:
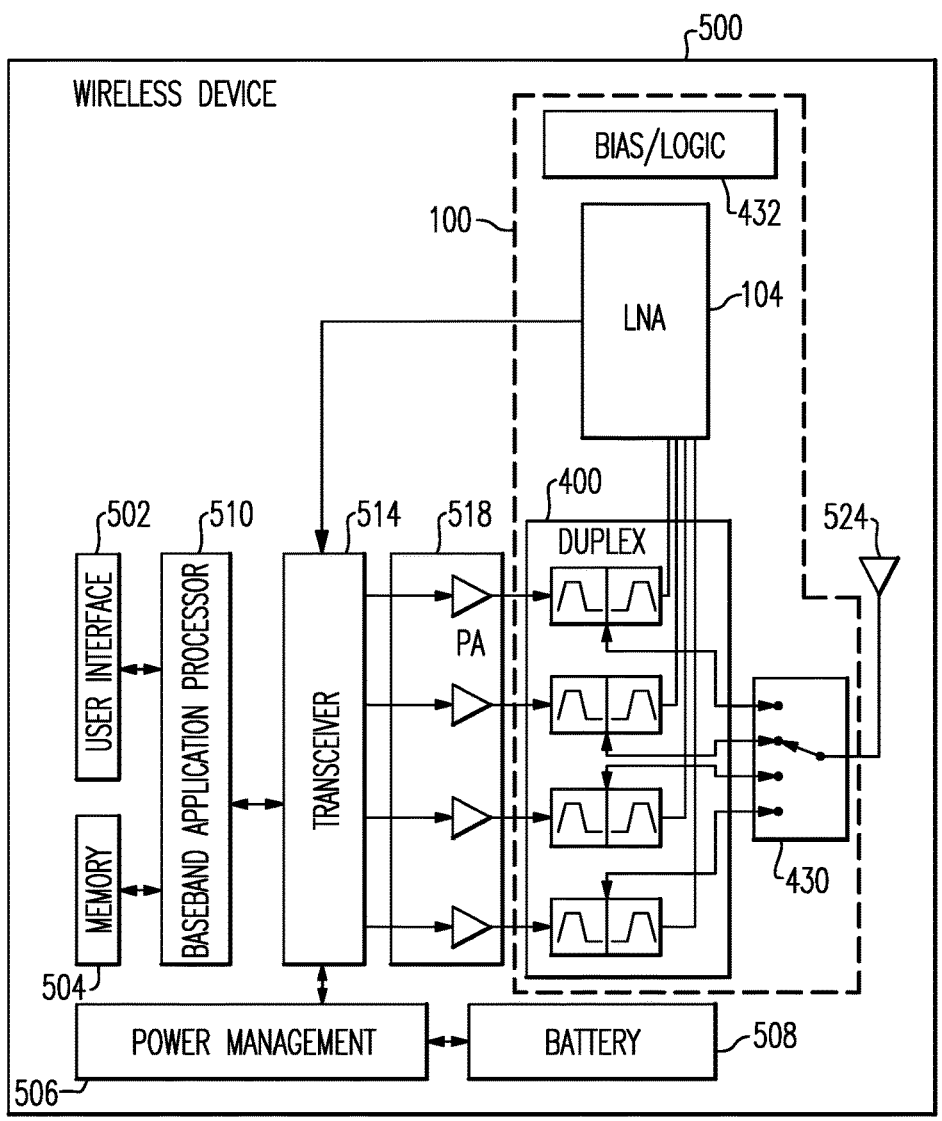
FIG. 11 shows an example of a wireless device having one or more features as described herein.

FIG. 10 shows that in some embodiments, a packaged module having one or more features as described herein can be implemented as a diversity receive (RX) module 100. In some applications, such a module can be implemented relatively close to a diversity antenna 420 so as to minimize or reduce losses and/or noise in a signal path 422.

The diversity RX module 100 in the example of FIG. 10 can be configured such that switches 410 and 412, as well as LNAs 414, are implemented in a semiconductor die (depicted as 104) that is mounted underneath a packaging substrate. One or more filters 400 can be mounted on such a packaging substrate as described herein.

As further shown in FIG. 10, RX signals processed by the diversity RX module 100 can be routed to a transceiver through a signal path 424. In wireless applications where the signal path 424 is relatively long and lossy, the foregoing implementation of the diversity RX module 100 close to the antenna 420 can provide a number of desirable features.

It will be understood that one or more features of the present disclosure can also be implemented in packaged modules having functionalities different than that of the diversity receive example of FIG. 10. For example, for any packaged BGA-based module where selective isolation (e.g., signal isolation) is desired on the underside, one or more features as described herein can be implemented.

FIG. 11 shows that in some embodiment a packaged module having one or more features as described herein can be implemented in a wireless device 500. For example, an LNA or LNA-related module 100 can be implemented as a packaged module as described herein, and such a module can be utilized with a main antenna 524.

The example LNA module 100 of FIG. 11 can include, for example, one or more LNAs 104, a bias/logic circuit 432, and a band-selection switch 430. Some or all of such circuits can be implemented in a semiconductor die that is mounted under a packaging substrate of the LNA module 100. In such an LNA module, some or all of duplexers 400 can be mounted on the packaging substrate so as to form a packaged module having one or more features as described herein.

FIG. 11 further depicts various features associated with the example wireless device 500. Although not specifically shown in FIG. 11, a diversity RX module 100 of FIG. 10 can be included in the wireless device 500 with the LNA module 100, in place of the LNA module 100, or any combination thereof. It will also be understood that a packaged module having one or more features as described herein can be implemented in the wireless device 500 as a non-LNA module.

In the example wireless device 500, a power amplifier (PA) circuit 518 having a plurality of PAs can provide an amplified RF signal to a switch 430 (via duplexers 400), and the switch 430 can route the amplified RF signal to an antenna 524. The PA circuit 518 can receive an unamplified RF signal from a transceiver 514 that can be configured and operated in known manners.

The transceiver 514 can also be configured to process received signals. Such received signals can be routed to the LNA 104 from the antenna 524, through the duplexers 400. Various operations of the LNA 104 can be facilitated by the bias/logic circuit 432.

The transceiver 514 is shown to interact with a baseband sub-system 510 that is configured to provide conversion between data and/or voice signals suitable for a user and RF signals suitable for the transceiver 514. The transceiver 514 is also shown to be connected to a power management component 506 that is configured to manage power for the operation of the wireless device 500. Such a power management component can also control operations of the baseband sub-system 510.

The baseband sub-system 510 is shown to be connected to a user interface 502 to facilitate various input and output of voice and/or data provided to and received from the user. The baseband sub-system 510 can also be connected to a memory 504 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

In various examples described herein, references are made to isolation for an underside part of a packaged module, isolation between two or more underside parts of a packaged module, etc. For the purpose of description, it will be understood that such an isolation can include isolation involving electromagnetic signal (e.g., RF signal being processed), electromagnetic noise, or any combination thereof. For a given part or region of a packaged module, such an isolation can reduce or eliminate impact of signal and/or noise resulting from another part/region, reduce or eliminate impact of signal and/or noise on another part/region if the signal and/or noise results from the given part, or any combination thereof. For the purpose of description, it will be understood that such other part/region can be within the packaged module or external to the packaged module.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged module comprising:
a packaging substrate having an upper side and an underside;
an upper-side component mounted on the upper side of the packaging substrate;
an overmold implemented on the upper side of the packaging substrate and dimensioned to encapsulate the upper-side component;
an underside component mounted to the underside of the packaging substrate; and
a ball grid array implemented on the underside of the packaging substrate to accommodate the underside component and to allow the packaged module to be mounted on a circuit board, the ball grid array having a height dimensioned to accommodate the underside component, the height of the ball grid array being greater than a height of the underside component, the ball grid array including a signal pin for passing of a signal, a plurality of non-ground pins, and a plurality of grounding shielding pins arranged to provide a selective electromagnetic isolation between the signal pin and the underside component, and to provide a selective electromagnetic isolation between the signal pin and another signal pin of the ball grid array, the ball grid array arranged such that one or more of the non-ground pins is/are positioned immediately next to a side of the underside component.

2. The packaged module of claim 1 wherein each of the plurality of grounding shielding pins includes a solder ball.

3. The packaged module of claim 1 wherein the underside component includes a semiconductor die or a surface-mount technology (SMT) device.

4. The packaged module of claim 1 wherein the packaged module is a dual-sided module having the ball grid array.

5. The packaged module of claim 1 wherein at least one of the underside component and the upper-side component is implemented to be a part of a radio-frequency circuit.

6. The packaged module of claim 1 further comprising a conformal shield layer implemented to cover an upper surface of the overmold and side walls defined by the overmold and the packaging substrate.

7. The packaged module of claim 1 further comprising a surface mounted component on the underside of the packaging substrate and having a ground path, the surface mounted component configured to provide an electromagnetic isolation.

8. A method for manufacturing a packaged module, the method comprising:
forming or providing a packaging substrate having an upper side and an underside;

mounting an upper-side component on the upper side of the packaging substrate;

implementing an overmold on the upper side of the packaging substrate to encapsulate the upper-side component;

arranging a ball grid array on the underside of the packaging substrate to define a mounting region; and mounting an underside component within the mounting region such that the ball grid array allows the packaged module to be mounted on a circuit board, and such that the ball grid array includes a signal pin for passing of a signal, a plurality of non-ground pins, and a plurality of grounding shielding pins arranged to provide a selective electromagnetic isolation between the signal pin and the underside component, and to provide a selective electromagnetic isolation between the signal pin and another signal pin of the ball grid array, the ball grid array arranged such that one or more of the non-ground pins is/are positioned immediately next to a side of the underside component, the ball grid array having a height dimensioned to accommodate the underside component, the height of the ball grid array being greater than a height of the underside component.

9. The method of claim 8 wherein each of the plurality of grounding shielding pins includes a solder ball.

10. The method of claim 8 wherein the underside component includes a semiconductor die or a surface-mount technology (SMT) device.

11. The method of claim 8 wherein the packaged module is a dual-sided module having the ball grid array.

12. The method of claim 8 wherein at least one of the underside component and the upper-side component is implemented to be a part of a radio-frequency circuit.

13. The method of claim 8 further comprising forming a conformal shield layer to cover an upper surface of the overmold and side walls defined by the overmold and the packaging substrate.

14. A wireless device comprising:
a circuit board configured to receive a plurality of modules;
a transceiver implemented on the circuit board;
an antenna in communication with the transceiver and configured to support either or both of transmission and reception of respective signals; and
a radio-frequency module mounted on the circuit board with a ball grid array of the radio-frequency module such that the radio-frequency module is electrically coupled between the transceiver and the antenna, the radio-frequency module including a packaging substrate having an upper side and an underside with the ball grid array implemented on the underside of the packaging substrate, the radio-frequency module further including an upper-side component mounted to the upper side of the packaging substrate, an overmold implemented on the upper side of the packaging substrate and dimensioned to encapsulate the upper-side component, and an underside component mounted to the underside of the packaging substrate, the ball grid array having a height dimensioned to accommodate the underside component, the height of the ball grid array being greater than a height of the underside component, the ball grid array including a signal pin for passing of a signal, a plurality of non-ground pins, and a plurality of grounding shielding pins arranged to provide a selective electromagnetic isolation between the signal pin and the underside component, and to provide electromagnetic isolation between the signal pin and another signal pin of the ball grid array, the ball grid array arranged such that one or more of the non-ground pins is/are positioned immediately next to a side of the underside component.

15. The wireless device of claim 14 wherein each of the plurality of grounding shielding pins includes a solder ball.

16. The wireless device of claim 14 wherein the underside component includes a semiconductor die or a surface-mount technology (SMT) device.

17. The wireless device of claim 14 wherein the radio-frequency module is a dual-sided module having the ball grid array.

18. The wireless device of claim 14 wherein at least one of the underside component and the upper-side component is implemented to be a part of a radio-frequency circuit.

19. The wireless device of claim 14 wherein the radio-frequency module further includes a conformal shield layer implemented to cover an upper surface of the overmold and side walls defined by the overmold and the packaging substrate.

20. The wireless device of claim 14 wherein the radio-frequency module further includes a surface mounted component on the underside of the packaging substrate and having a ground path, the surface mounted component configured to provide an electromagnetic isolation.

* * * * *